(12) United States Patent
Lof et al.

(10) Patent No.: US 7,388,648 B2
(45) Date of Patent: Jun. 17, 2008

(54) LITHOGRAPHIC PROJECTION APPARATUS

(75) Inventors: Joeri Lof, Eindhoven (NL); Antonius Theodorus Anna Maria Derksen, Eindoven (NL); Christiaan Alexander Hoogendam, Veldhoven (NL); Aleksey Kolesnychenko, Nijmegen (NL); Erik Roelof Loopstra, Heeze (NL); Theodorus Marinus Modderman, Nuenen (NL); Johannes Catharinus Hubertus Mulkens, Maastricht (NL); Roelof Aeilko Siebrand Ritsema, Eindhoven (NL); Klaus Simon, Eindhoven (NL); Joannes Theodoor De Smit, Eindhoven (NL); Alexander Straaijer, Eindhoven (NL); Bob Streefkerk, Tilburg (NL); Helmar Van Santen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 89 days.

(21) Appl. No.: 11/239,493

(22) Filed: Sep. 30, 2005

(65) Prior Publication Data

US 2006/0023189 A1 Feb. 2, 2006

Related U.S. Application Data

(63) Continuation of application No. 10/705,783, filed on Nov. 12, 2003, now Pat. No. 6,952,253.

(30) Foreign Application Priority Data

Nov. 12, 2002 (EP) ................................. 02257822
May 13, 2003 (EP) ................................. 03252955

(51) Int. Cl.
*G03B 27/42* (2006.01)
*G02B 3/06* (2006.01)

(52) U.S. Cl. ........................................ 355/53; 359/665

(58) Field of Classification Search .................. 355/30, 355/53, 67; 359/665
See application file for complete search history.

(56) References Cited

U.S. PATENT DOCUMENTS 3,573,975 A 4/1971 Dhaka et al. ................. 117/212

(Continued)

FOREIGN PATENT DOCUMENTS

DE 206 607 2/1984

(Continued)

OTHER PUBLICATIONS

Japanese Office Action issued for Japanese Patent Application No. 2003-417259, dated Dec. 18, 2006.

(Continued)

*Primary Examiner*—Diane Lee
*Assistant Examiner*—Chia-how Michael Liu
(74) *Attorney, Agent, or Firm*—Pillsbury Winthrop Shaw Pittman, LLP

(57) ABSTRACT

A lithographic projection apparatus includes a liquid confinement structure extending along at least a part of a boundary of a space between a projection system and a substrate table. The liquid confinement structure is positioned adjacent a final surface of the projection system and includes a first inlet configured to supply a liquid, through which a patterned beam is to be projected, to the space, and a second inlet configured to supply gas and formed in a face of the structure. The face is arranged to oppose a surface of the substrate and the second inlet is located radially outward, with respect to an optical axis of the projection system, of the space and has a porous member to evenly distribute gas flow over an area of the second inlet.

20 Claims, 7 Drawing Sheets

U.S. PATENT DOCUMENTS

| | | | |
|---|---|---|---|
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,441,808 A | 4/1984 | Giacomelli | |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,528,100 A | 6/1996 | Igeta et al. | |
| 5,610,683 A | 3/1997 | Takahashi | 355/53 |
| 5,668,672 A | 9/1997 | Oomura | |
| 5,689,377 A | 11/1997 | Takahashi | |
| 5,715,039 A | 2/1998 | Fukuda et al. | 355/53 |
| 5,825,043 A | 10/1998 | Suwa | 250/548 |
| 5,835,275 A | 11/1998 | Takahashi | |
| 5,874,820 A | 2/1999 | Lee | |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,438,074 B1 | 8/2002 | Aki et al. | |
| 6,560,032 B2 | 5/2003 | Hatano | 359/656 |
| 6,600,547 B2 | 7/2003 | Watson et al. | 250/492.1 |
| 6,603,130 B1 | 8/2003 | Bisschops et al. | 250/492.1 |
| 6,633,365 B2 | 10/2003 | Suenaga | 355/53 |
| 6,788,477 B2 * | 9/2004 | Lin | 359/820 |
| 6,867,844 B2 | 3/2005 | Vogel et al. | |
| 6,952,253 B2 | 10/2005 | Lof et al. | |
| 2002/0020821 A1 | 2/2002 | Van Santen et al. | 250/492 |
| 2002/0163629 A1 | 11/2002 | Switkes et al. | 355/53 |
| 2003/0030916 A1 | 2/2003 | Suenaga | |
| 2003/0123040 A1 | 7/2003 | Almogy | 355/69 |
| 2003/0174408 A1 | 9/2003 | Rostalski et al | 359/642 |
| 2004/0000627 A1 | 1/2004 | Schuster | 250/201.2 |
| 2004/0021844 A1 | 2/2004 | Suenaga | 355/67 |
| 2004/0075895 A1 | 4/2004 | Lin | 359/380 |
| 2004/0109237 A1 | 6/2004 | Epple et al. | 359/649 |
| 2004/0118184 A1 | 6/2004 | Violette | |
| 2004/0119954 A1 | 6/2004 | Kawashima et al. | 355/30 |
| 2004/0125351 A1 | 7/2004 | Krautschik et al. | 355/53 |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | 355/30 |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0100745 A1 | 5/2005 | Lin et al. | |
| 2005/0117224 A1 | 6/2005 | Shafer et al. | |
| 2005/0122497 A1 | 6/2005 | Lyons et al. | |
| 2005/0140948 A1 | 6/2005 | Tokita | 345/7 |
| 2005/0141098 A1 | 6/2005 | Schuster | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0225737 A1 | 10/2005 | Weissenrieder et al. | |
| 2005/0259234 A1 | 11/2005 | Hirukawa et al. | |
| 2005/0270505 A1 | 12/2005 | Smith | |
| 2005/0286032 A1 | 12/2005 | Lof et al. | |
| 2006/0012765 A1 | 1/2006 | Kameyama | |
| 2006/0023184 A1 | 2/2006 | Coon et al. | |
| 2006/0033899 A1 | 2/2006 | Hazelton et al. | |
| 2006/0114445 A1 | 6/2006 | Ebihara | |
| 2007/0132974 A1 | 6/2007 | Hazelton et al. | |

FOREIGN PATENT DOCUMENTS

| | | |
|---|---|---|
| DE | 221 563 | 4/1985 |
| DE | 224 448 A1 | 7/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | A 57-153433 | 9/1982 |
| JP | 58-202448 | 11/1983 |
| JP | A 59-19912 | 2/1984 |
| JP | 62-065326 | 3/1987 |
| JP | 62-121417 | 6/1987 |
| JP | 63-49893 | 3/1988 |
| JP | 63-157419 | 6/1988 |
| JP | 04-305915 | 10/1992 |
| JP | 04-305917 | 10/1992 |
| JP | A 05-62877 | 3/1993 |
| JP | 6-168866 | 4/1994 |
| JP | 06-124873 | 5/1994 |
| JP | 07-132262 | 5/1995 |
| JP | 07-220990 | 8/1995 |
| JP | A 08-136475 | 5/1996 |
| JP | A 08-171054 | 7/1996 |
| JP | A 08-316125 | 11/1996 |
| JP | A 08-330224 | 12/1996 |
| JP | A 08-334695 | 12/1996 |
| JP | A 10-003039 | 1/1998 |
| JP | A 10-020195 | 1/1998 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2000-331931 | 11/2000 |
| JP | 2001-091849 | 4/2001 |
| JP | 2002-513856 | 5/2002 |
| JP | 2004-193252 | 7/2004 |
| WO | WO 99/49504 | 9/1999 |
| WO | WO 02/091078 A1 | 11/2002 |
| WO | WO 03/077036 | 9/2003 |
| WO | WO 03/077037 | 9/2003 |
| WO | WO 2004/019128 | 3/2004 |

| | | |
|---|---|---|
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/081666 A1 | 9/2004 |
| WO | WO 2004/092077154 A1 | 9/2004 |
| WO | WO 2004/86470 A1 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092830 A3 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093159 A3 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/029617 A2 | 6/2005 |
| WO | WO 2005/054955 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/0654953 A2 | 6/2005 |
| WO | WO 2005050324 A2 | 6/2005 |
| WO | WO 2005/062128 A2 | 7/2005 |
| WO | WO 2005/064400 A2 | 7/2005 |
| WO | WO 2005/069078 A1 | 7/2005 |
| WO | WO 2005/069081 A2 | 7/2005 |
| WO | WO 2005/094405 A2 | 7/2005 |
| WO | WO 2005/0644400 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |

OTHER PUBLICATIONS

U.S. Appl. No. 10/705,805, filed Nov. 12, 2003, Lof et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/724,402, filed Dec. 1, 2003, Simon et al.
U.S. Appl. No. 10/705,804, filed Nov. 12, 2003, Desmit et al.
U.S. Appl. No. 10/705,785, filed Nov. 12, 2003, Derksen et al.
U.S. Appl. No. 10/715,116, filed Nov. 18, 2003, Bleeker.
U.S. Appl. No. 10/719,683, filed Nov. 24, 2003, Streefkerk et al.
U.S. Appl. No. 10/705,816, filed Nov. 12, 2003, Lof et al.
U.S. Appl. No. 10/775,326, filed Feb. 11, 2004, Dierichs.
U.S. Appl. No. 10/773,461, filed Feb. 9, 2004, Duineveld et al.
U.S. Appl. No. 10/698,012, filed Oct. 31, 2003, Flagello et al.
U.S. Appl. No. 10/844,575, filed May 13, 2004, Streefkerk et al.
EP Search Report for EP 02257938 dated Sep. 25, 2003.
M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.
G. Owen et al., "1/8 µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics Technology/World, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
European Search Report for EP Application No. 02257822.3 dated Jan. 20, 2004.
S. Owa et al., "Update of 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, NI. 11, Apr. 1985, p. 6521.
A. Suzuki, "Lithography Advances on Multiple Fronts", EEdisign, EE Times, Jan. 5, 2004.
B. Lin, The $\kappa_3$ coefficient in nonparaxial $\lambda$/NA scaling equations for resolution, depth of focus, and immersion lithograpy, *J. Microlith., Microfab., Microsyst.* 1(1):7-12 (2002).
M. Switkes et al., "Immersion Lithography: Optics for the 50 nm Node", 157 Anvers-1, Sep. 4, 2002.
European Search Report for European Application No. 03257070.7, dated Aug. 24, 2005.
Information Disclosure Statement filed Feb. 2, 2007 for U.S. Appl. No. 11/701,378.
Office Action dated Aug. 1, 2006 issued for U.S. Appl. No. 11/253,597.
Information Disclosure Statement filed Oct. 20, 2005 for U.S. Appl. No. 11/253,597.

* cited by examiner

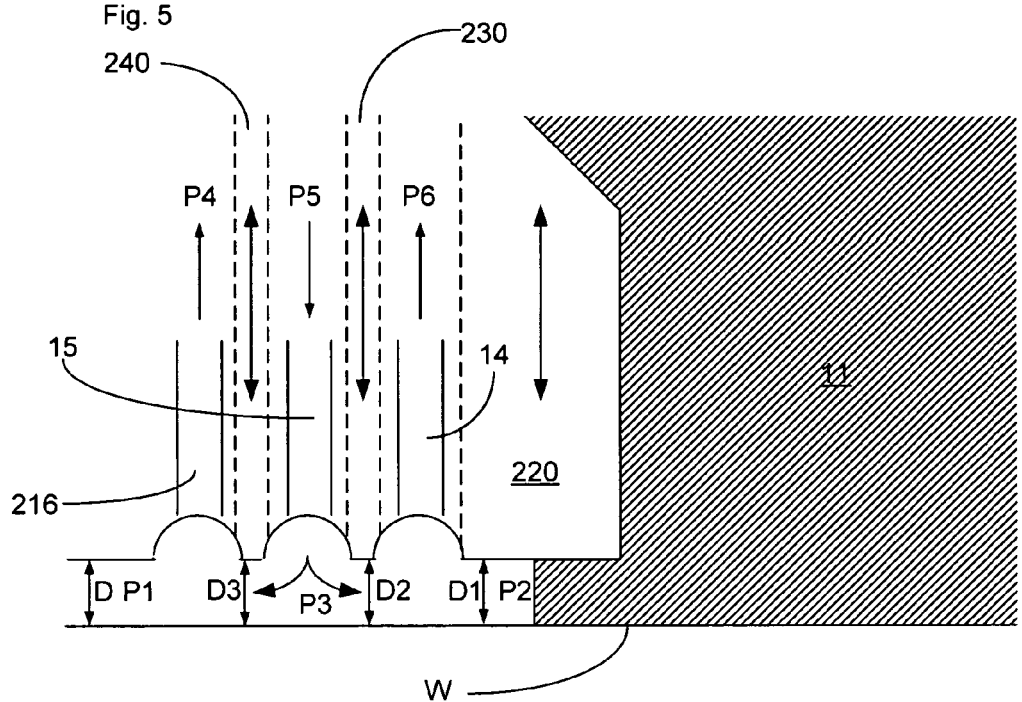
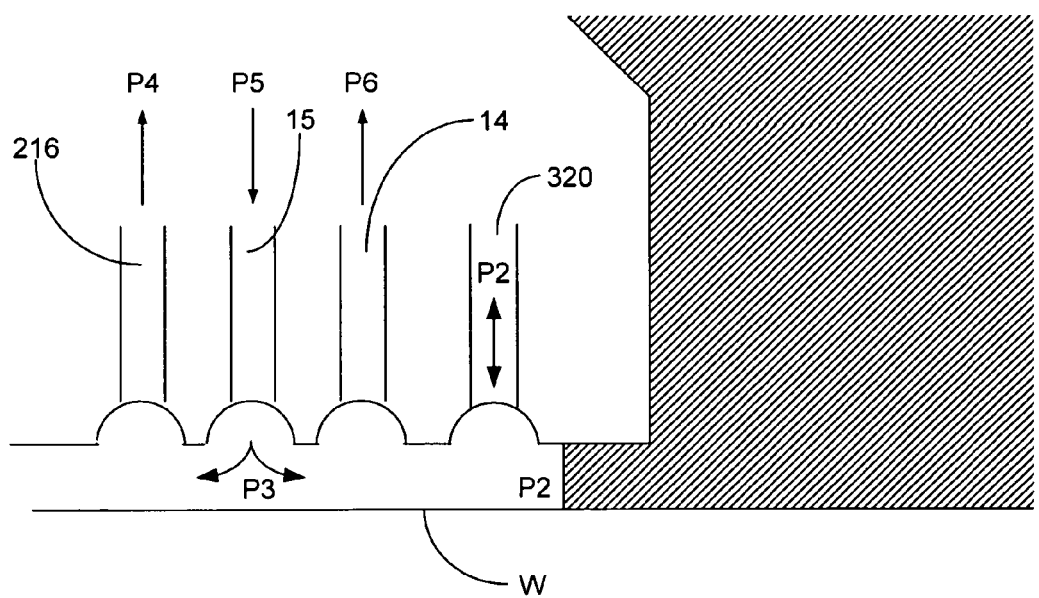

LITHOGRAPHIC PROJECTION APPARATUS

This application is a continuation of U.S. patent application Ser. No. 10/705,783, filed Nov. 12, 2003, to be issued as U.S. Pat. No. 6,952,253 on Oct. 4, 2005, which claims priority from European patent applications EP 02257822.3, filed Nov. 12, 2002, and EP 03252955.4, filed May 13, 2003, all of the above-referenced applications herein incorporated in their entirety by reference.

FIELD

The present invention relates to immersion lithography.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from United States patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (e.g. silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in a lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system.)

PCT patent application WO 99/49504 discloses a lithographic apparatus in which a liquid is supplied to the space between the projection lens and the wafer. As the wafer is scanned beneath the lens in a −X direction, liquid is supplied at the +X side of the lens and taken up at the −X side.

SUMMARY

Submersing the substrate table in liquid may mean that there is a large body of liquid that must be accelerated during a scanning exposure. This may require additional or more powerful motors and turbulence in the liquid may lead to undesirable and unpredictable effects.

There are several difficulties associated with having liquids in a lithographic projection apparatus. For example, escaping liquid may cause a problem by interfering with interferometers and, if the lithographic projection apparatus requires the beam to be held in a vacuum, by destroying the vacuum. Furthermore, the liquid may be used up at a high rate unless suitable precautions are taken.

Further problems associated with immersion lithography may include the difficulty in keeping the depth of the liquid constant and transfer of substrates to and from the imaging position, i.e., under the final projection system element. Also, contamination of the liquid (by chemicals dissolving in it) and increase in temperature of the liquid may deleteriously affect the imaging quality achievable.

In the event of a computer failure or power failure or loss of control of the apparatus for any reason, steps may need to be taken to protect, in particular, the optical elements of the projection system. It may be necessary to take steps to avoid spillage of the liquid over other components of the apparatus.

If a liquid supply system is used in which the liquid has a free surface, steps may need to be taken to avoid the development of waves in that free surface due to forces applied to the liquid supply system. Waves can transfer vibrations to the projection system from the moving substrate.

Accordingly, it may be advantageous to provide, for example, a lithographic projection apparatus in which a space between the substrate and the projection system is filled with a liquid while minimizing the volume of liquid that must be accelerated during stage movements.

According to an aspect, there is provided a lithographic projection apparatus, comprising:
a support structure configured to hold a patterning device, the patterning device configured to pattern a beam of radiation according to a desired pattern;
a substrate table configured to hold a substrate;
a projection system configured to project the patterned beam onto a target portion of the substrate; and
a liquid supply system configured to at least partly fill a space between said projection system and said substrate, with a liquid through which said beam is to be projected, said liquid supply system comprising:
a liquid confinement structure extending along at least a part of the boundary of said space between said projection system and said substrate table, and
a gas seal between said structure and the surface of said substrate.

A gas seal forms a non-contact seal between the structure and the substrate so that the liquid is substantially contained in the space between the projection system and the substrate, even as the substrate moves under the projection system, e.g. during a scanning exposure.

The structure may be provided in the form of a closed loop, whether circular, rectangular, or other shape, around the space or may be incomplete, e.g., forming a U-shape or even just extending along one side of the space. If the structure is incomplete, it should be positioned to confine the liquid as the substrate is scanned under the projection system.

In an embodiment, the gas seal comprises a gas bearing configured to support said structure. This has an advantage that the same part of the liquid supply system can be used both to bear the structure and to seal liquid in a space between the projection system and the substrate, thereby reducing the complexity and weight of the structure. Also, previous experience gained in the use of gas bearings in vacuum environments can be called on.

In an embodiment, the gas seal comprises a gas inlet formed in a face of said structure that opposes said substrate to supply gas and a first gas outlet formed in a face of said structure that opposes said substrate to extract gas. Further, there may be provided a gas supply to provide gas under pressure to said gas inlet and a vacuum device to extract gas from said first gas outlet. In an embodiment, the gas inlet is located further outward from the optical axis of said projection system than said first gas outlet. In this way, the gas flow in the gas seal is inward and may most efficiently contain the liquid. In this case, the gas seal may further comprises a second gas outlet formed in the face of the structure which opposes the substrate, the first and second gas outlets being formed on opposite sides of the gas inlet. The second gas outlet helps to ensure minimal escape of gas from the gas inlet into an environment surrounding the structure. Thus, the risk of gas escaping and interfering with, for example, the interferometers or degrading a vacuum in the lithographic apparatus, is minimized.

The liquid supply system may also comprise a sensor configured to measure the distance between the face of the structure and the substrate and/or the topography of the top surface of the substrate. In this way, controller can be used to vary the distance between the face of the structure and the substrate by controlling, for example, the gas seal either in a feed-forward or a feed-back manner.

The apparatus may further comprise a positioning device configured to vary the level of a portion of said face of said structure between the first gas outlet and an edge of the face nearest the optical axis relative to the remainder of the face. This allows a pressure containing the liquid in the space, to be controlled independently of the pressure below the inlet so that the height of the structure over the substrate can be adjusted without upsetting the balance of forces holding liquid in the space. An alternative way of ensuring this is to use a positioning device configured to vary the level of a portion of the face between the first or second gas outlets and the gas inlet relative to the remainder of the face. Those three systems may be used in any combination.

In an embodiment, there is provided a channel formed in the face of the structure located nearer to the optical axis of the projection system than the first gas outlet. The pressure in that channel can be varied to contain the liquid in the space whereas the gas in and out-lets may be used to vary the height of the structure above the substrate so that they only operate to support the structure and have little, if any, sealing function. In this way, it may possible to separate a sealing function and a bearing function of the gas seal.

In an embodiment, a porous member may be disposed over the gas inlet for evenly distributing gas flow over the area of the gas inlet.

In an embodiment, the gas in and out-lets may each comprise a groove in said face of said structure opposing said substrate and a plurality of conduits leading into said groove at spaced locations.

In an embodiment, the gap between said structure and the surface of said substrate inwardly of said gas seal is small so that capillary action draws liquid into the gap and/or gas from the gas seal is prevented from entering the space. The balance between the capillary forces drawing liquid under the structure and the gas flow pushing it out may form a particularly stable seal.

In an embodiment, the liquid supply system is configured to at least partly fill a space between a final lens of the projection system and the substrate, with liquid.

It may also be advantageous to provide, for example, a lithographic projection apparatus in which a space between the substrate and the projection system is filled with a liquid while minimizing a transmission of disturbance forces between the substrate and projection system.

According to an aspect, there is provided a lithographic apparatus, comprising:
a support structure configured to hold a patterning device, the patterning device configured to pattern a beam of radiation according to a desired pattern;
a substrate table configured to hold a substrate;
a projection system configured to project the patterned beam onto a target portion of the substrate; and
a liquid supply system configured to at least partly fill a space between the final element of said projection system and said substrate with a liquid, wherein said space is in liquid connection with a liquid reservoir through a duct, and the minimum cross sectional area of said duct in a plane perpendicular to the direction of fluid flow is at least $$\pi\left(\frac{8\Delta V \eta L}{\pi \Delta P_{max} t_{min}}\right)^{1/2},$$

where $\Delta V$ is the volume of liquid which has to be removed from said space within time $t_{min}$, L is the length of the duct, $\eta$ is viscosity of liquid in said space and $\Delta P_{max}$ is the maximum allowable pressure on an element of said projection system.

Liquid may be completely constrained such that it does not have a large free surface for the development of waves, i.e., the space or reservoir is enclosed at the top and the reservoir is full of liquid. This is because the amount of fluid which can flow through the duct in a given time (time of crash measured experimentally) is large enough to avoid damage to the final element of the projection system when the apparatus crashes because the liquid can escape through the duct before pressure in the space builds up to levels at which damage may occur. The liquid escapes when the structure moves relative to the element otherwise the hydrostatic pressure applied to an element of the projection system during relative movement of the element to the structure may damage the element.

According to an aspect, there is provided a lithographic apparatus, comprising:
a support structure configured to hold a patterning device, the patterning device configured to pattern a beam of radiation according to a desired pattern;
a substrate table configured to hold a substrate;
a projection system configured to project the patterned beam onto a target portion of the substrate;
a liquid supply system configured to at least partly fill a space between said projection system and said substrate with a liquid, said liquid supply system comprising, on a top surface of liquid in said liquid supply system, a wave suppression device configured to suppress development of waves.

In this way, the development of waves can be suppressed by contact of the wave suppression device with a top surface of the liquid. In an embodiment, the wave suppression device comprises a pressure release device. Thus, the liquid can escape from the space in the event of a crash to avoid damaging the element.

An example of a wave suppression device is a flexible membrane. In an embodiment, the wave suppression device may comprise placing a high viscosity liquid which is immiscible with the liquid in the space on the top surface of the liquid in the space. In each of these cases, the pressure release functionality can be provided by the flexibility of the wave suppression device.

According to an aspect, there is provided a device manufacturing method comprising:
providing a liquid to a space between a projection system and a substrate;
projecting a patterned beam of radiation, through said liquid, onto a target portion of the substrate using the projection system; and
forming a gas seal between a liquid confinement structure extending along at least a part of the boundary of said space and the surface of said substrate; or
providing a liquid reservoir in liquid connection with said space through a duct and ensuring that said duct has a minimum cross-sectional area in a plane perpendicular to the direction of flow of liquid of $$\pi\left(\frac{8\Delta V \eta L}{\pi \Delta P_{max} t_{min}}\right)^{1/2},$$

where $\Delta V$ is the volume of liquid which has to be removed from said space within time $t_{min}$, L is the length of the duct, $\eta$ is viscosity of liquid in said space and $\Delta P_{max}$ is the maximum allowable pressure on an element of said projection system; or
suppressing development of waves on said liquid with a suppression means and optionally, allowing for release of pressure of said liquid.

Although specific reference may be made in this text to the use of the apparatus disclosed herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings, in which:

FIG. 5 is an enlarged view of part of the liquid reservoir of the second embodiment of the invention;

FIG. 6 is an enlarged view of the liquid reservoir of a third embodiment of the present invention;

In the Figures, corresponding reference symbols indicate corresponding parts.

DETAILED DESCRIPTION

EMBODIMENT 1

Figure 1:
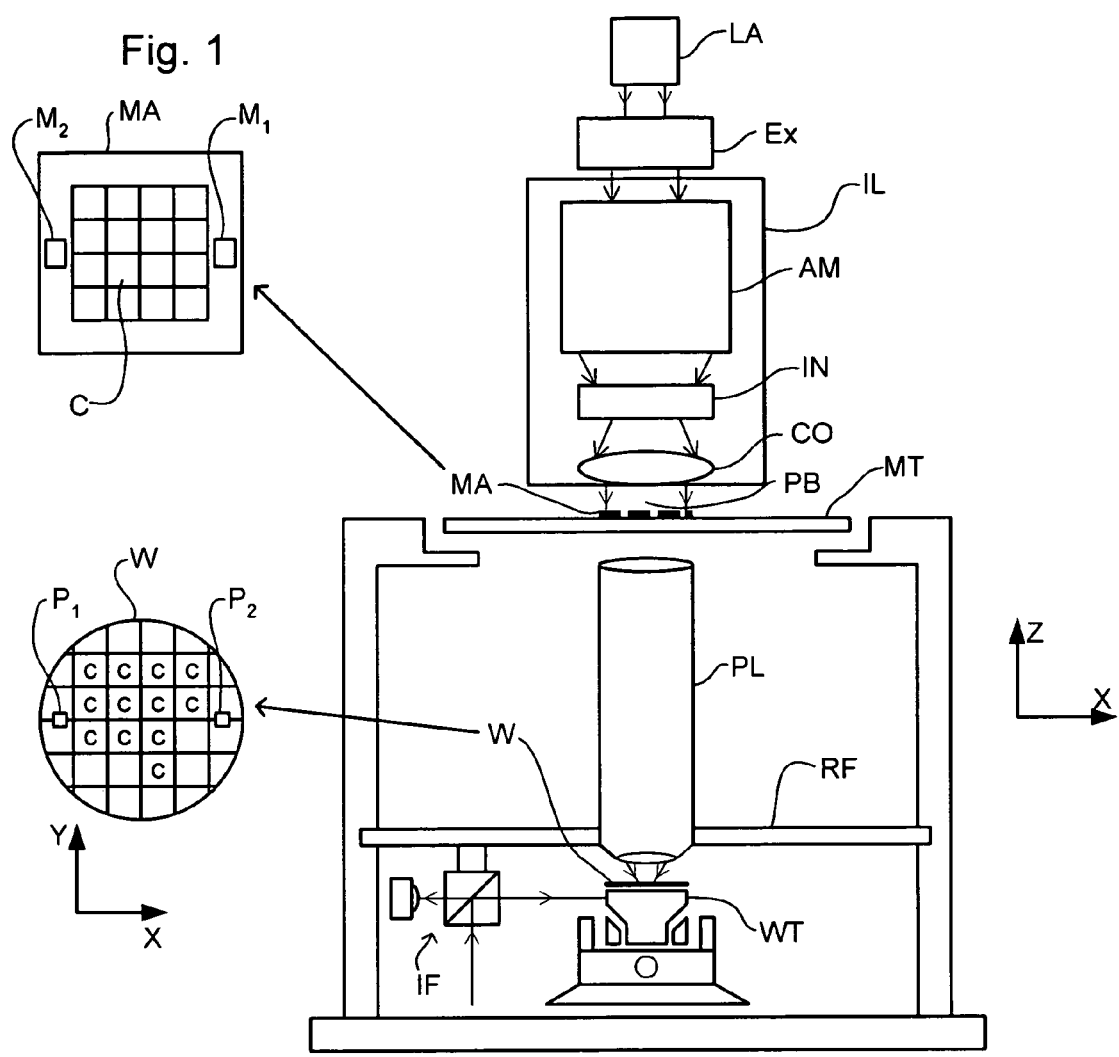
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning means, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also. be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different-modes:

In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
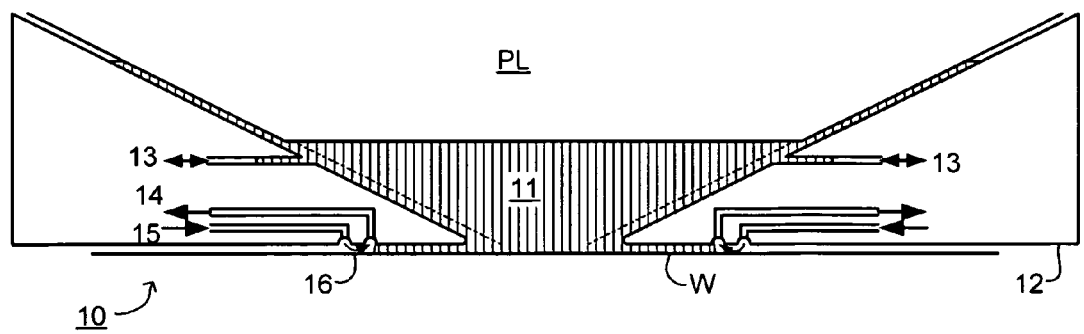
FIG. 2 depicts the liquid reservoir of a first embodiment of the invention.

FIG. 2 shows a liquid reservoir 10 between the projection system PL and a substrate stage. The liquid reservoir 10 is filled with a liquid 11 having a relatively high refractive index, e.g. water, provided via inlet/outlet ducts 13. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

The reservoir 10 forms a contactless seal to the substrate around the image field of the projection system so that liquid is confined to fill a space between the substrate W surface and the final element of the projection system PL. The reservoir is formed by a seal member 12 positioned below and surrounding the final element of the projection system PL. Liquid is brought into the space below the projection system PL and within the seal member 12. The seal member 12 extends a little above the final element of the projection system PL and the liquid level rises above the final element so that a buffer of liquid is provided. The seal member 12 has an inner periphery that at the upper end, in an embodiment, closely conforms to the step of the projection system or the final element thereof and may, e.g., be round. At the bottom, the inner periphery closely conforms to the shape of the image field, e.g., rectangular though this need not be the case.

Figure 3:
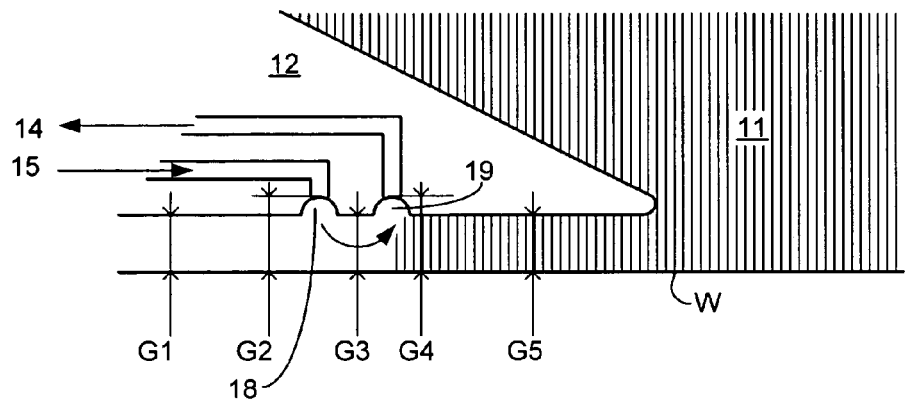
FIG. 3 is an enlarged view of part of the liquid reservoir of the first embodiment of the invention.

The liquid is confined in the reservoir by a gas seal 16 between the bottom of the seal member 12 and the surface of the substrate W. The gas seal is formed by gas, e.g. air or synthetic air but in an embodiment, $N_2$ or another inert gas, provided under pressure via inlet 15 to the gap between seal member 12 and the substrate W and extracted via first outlet 14. The overpressure on the gas inlet 15, vacuum level on the first outlet 14 and geometry of the gap are arranged so that there is a high-velocity gas flow inwards that confines the liquid. This is shown in more detail in FIG. 3.

The gas seal is formed by two (annular) grooves 18, 19 which are connected to the first inlet 15 and first outlet 14 respectively by a series of small conducts spaced around the grooves. The in-and out-lets 14, 15 may either be a plurality of discrete orifices around the circumference of the seal member 12 or may be continuous grooves or slits. A large (annular) hollow in the seal member may be provided in each of the inlet and outlet to form a manifold. The gas seal may also be effective to support the seal member 12 by behaving as a gas bearing.

Gap G1, on the outer side of the gas inlet 15, is, in an embodiment, small and long so as to provide resistance to gas flow outwards but need not be. Gap G2, at the radius of the inlet 15, is a little larger to ensure a sufficient distribution of gas around the seal member, the inlet 15 being formed by a number of small holes around the seal member. Gap G3 is chosen to control the gas flow through the seal. Gap G4 is larger to provide a good distribution of vacuum, the outlet 14 being formed of a number of small holes in the same or similar manner as the inlet 15. Gap G5 is small to prevent gas/oxygen diffusion into the liquid in the space, to prevent a large volume of liquid entering and disturbing the vacuum and to ensure that capillary action will always fill it with liquid.

The gas seal is thus a balance between the capillary forces pulling liquid into the gap and the gas flow pushing liquid out. As the gap widens from G5 to G4, the capillary forces decrease and the gas flow increases so that the liquid boundary will lie in this region and be stable even as the substrate moves under the projection system PL.

The pressure difference between the inlet, at G2 and the outlet at G4 as well as the size and geometry of gap G3, determine the gas flow through the seal 16 and will be determined according to the specific embodiment. However, a possible advantage is achieved if the length of gap G3 is short and the absolute pressure at G2 is twice that at G4, in which case the gas velocity will be the speed of sound in the gas and cannot rise any higher. A stable gas flow will therefore be achieved.

The gas outlet system can also be used to completely remove the liquid from the system by reducing the gas inlet pressure and allowing the liquid to enter gap G4 and be sucked out by the vacuum system, which can easily be arranged to handle the liquid, as well as the gas used to form the seal. Control of the pressure in the gas seal can also be used to ensure a flow of liquid through gap G5 so that liquid in this gap that is heated by friction as the substrate moves does not disturb the temperature of the liquid in the space below the projection system.

The shape of the seal member around the gas inlet and outlet should be chosen to provide laminar flow as far as possible so as to reduce turbulence and vibration. Also, the gas flow should be arranged so that the change in flow direction at the liquid interface is as large as possible to provide maximum force confining the liquid.

The liquid supply system circulates liquid in the reservoir 10 so that fresh liquid is provided to the reservoir 10.

The gas seal 16 can produce a force large enough to support the seal member 12. Indeed, it may be necessary to bias the seal member 12 towards the substrate to make the effective weight supported by the seal member 12 higher. The seal member 12 will in any case be held in the XY plane (perpendicular to the optical axis) in a substantially stationary position relative to and under the projection system but decoupled from the projection system. The seal member 12 is free to move in the Z direction and Rx and Ry.

EMBODIMENT 2

Figure 4:
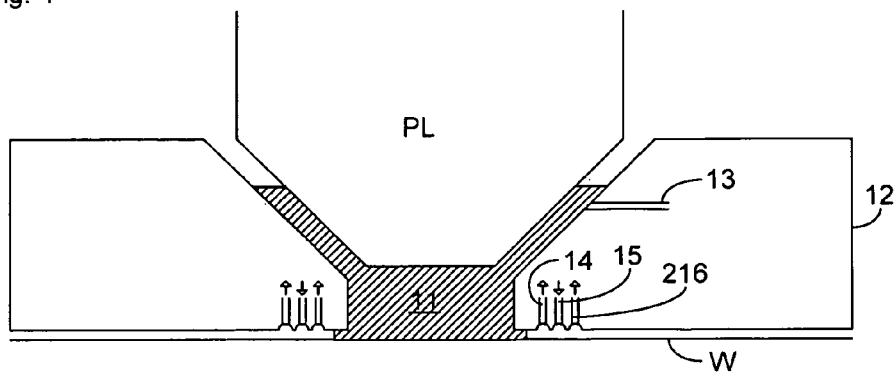
FIG. 4 depicts the liquid reservoir of a second embodiment of the invention.

A second embodiment is illustrated in FIGS. 4 and 5 and is the same as the first embodiment except as described below.

In this embodiment a second gas outlet 216 is provided on the opposite side of the gas inlet 15 to the first gas outlet 14. In this way any gas escaping from the gas inlet 15 outwards away from the optical axis of the apparatus is sucked up by second gas outlet 216 which is connected to a vacuum source. In this way gas is prevented from escaping from the gas seal so that it cannot interfere, for example, with interferometer readings or with a vacuum in which the projection system and/or substrate may be housed.

Another advantage of using the two gas outlet embodiment is that the design is very similar to that of gas bearings previously used in lithographic projection apparatus. Thus the experience gained with those gas bearings can be applied directly to the gas seal of this embodiment. The gas seal of the second embodiment is particularly suitable for use as a gas bearing, as well as a seal means, such that it can be used to support the weight of the seal member 12.

Advantageously one or more sensors may be provided to either measure the distance between the bottom face of the seal member 12 and the substrate W or the topography of the top surface of the substrate W. A controller may then be used to vary the pressures applied to the gas in- and out-lets 14, 15, 216 to vary the pressure P2 which constrains the liquid 11 in the reservoir and the pressures P1 and P3 which support the seal member 12. Thus the distance D between the seal member 12 and the substrate W may be varied or kept at a constant distance. The same controller may be used to keep the seal member 12 level. The controller may use either a feed forward or a feedback control loop.

FIG. 5 shows in detail how the gas seal can be regulated to control independently the pressure P2 holding the liquid 11 in the reservoir and P3 which supports the seal member 12. This extra control is advantageous because it provides a way of minimizing liquid losses during operation. The second embodiment allows pressures P2 and P3 to be controlled independently to account for varying conditions during exposure. Varying conditions might be different levels of liquid loss per unit time because of different scanning speeds or perhaps because the edge of a substrate W is being overlapped by the seal member 12. This is achieved by providing means for varying the distance to the substrate W of discrete portions of the face of the seal member 12 facing the substrate W. These portions include the portion 220 between the first gas outlet 14 and the edge of the seal member 12 nearest the optical axis, the portion 230 between the gas inlet 15 and the first gas outlet 14 and the portion 240 between the second gas outlet 216 and the gas inlet 15. These portions may be moved towards and away from the substrate W by the use of piezoelectric actuators for example. That is the bottom face of the seal member 12 may comprise piezoelectric actuators (e.g., stacks) which can be expanded/contracted by the application of a potential difference across them. Other mechanical means could also be used.

The pressure P3 which is created below the gas inlet 15 is determined by the pressure of gas P5 applied to the gas inlet 15, pressures of gas P6 and P4 applied to the first and second gas outlets 14 and 216 respectively and by the distance D between the substrate W and the bottom face of the seal member 12 facing the substrate W. Also the horizontal distance between the gas in and out-lets has an effect.

The weight of the seal member 12 is compensated for by the pressure of P3 so that the seal member 12 settles a distance D from the substrate W. A decrease in D leads to an increase in P3 and an increase in D will lead to a decrease in P3. Therefore this is a self regulating system.

Distance D, at a constant pushing force due to pressure P3, can only be regulated by pressures P4, P5 and P6. However, the combination of P5, P6 and D creates pressure P2 which is the pressure keeping the liquid 11 in the reservoir. The amount of liquid escaping from a liquid container at given levels of pressure can be calculated and the pressure in the liquid $P_{LIQ}$ is also important. If $P_{LIQ}$ is larger than P2, the liquid escapes from the reservoir and if $P_{LIQ}$ is less than P2, gas bubbles will occur in the liquid which is undesirable. It is desirable to try to maintain P2 at a value slightly less than $P_{LIQ}$ to ensure that no bubbles form in the liquid but also to ensure that not too much liquid escapes as this liquid needs to be replaced. In an embodiment, this can all be done with a constant D. If the distance D1 between portion 220 and the substrate W is varied, the amount of liquid escaping from the reservoir can be varied considerably as the amount of liquid escaping varies as a square of distance D1. The variation in distance is only of the order of 1 mm, in an embodiment 10 µm and this can easily be provided by a piezoelectric stack with an operational voltage of the order of 100V or more.

Alternatively, the amount of liquid which can escape can be regulated by placing a piezoelectric element at the bottom of portion 230. Changing the distance D2 is effective to change pressure P2. However, this solution might require adjustment of pressure P5 in gas inlet 15 in order to keep D constant.

Of course the distance D3 between the lower part of portion 240 and substrate W can also be varied in a similar way and can be used to regulate independently P2 and P3. It will be appreciated that pressures P4, P5 and P6 and distances D1, D2 and D3 can all be regulated independently or in combination to achieve the desired variation of P2 and P3.

Indeed the second embodiment is particularly effective for use in active management of the quantity of liquid in the reservoir 10. The standby situation of the projection apparatus could be, where no substrate W is being imaged, that the reservoir 10 is empty of liquid but that the gas seal is active thereby to support the seal member 12. After the substrate W has been positioned, liquid is introduced into the reservoir 10. The substrate W is then imaged. Before the substrate W is removed, the liquid from the reservoir can be removed. After exposure of the last substrate the liquid in-the reservoir 10 will be removed. Whenever liquid is removed, a gas purge has to be applied to dry the area previously occupied by liquid. The liquid can obviously be removed easily in the apparatus according to the second embodiment by variation of P2 while maintaining P3 constant as described above. In other embodiments a similar effect can be achieved by varying P5 and P6 (and P4 if necessary or applicable).

EMBODIMENT 3

As an alternative or a further development of the second embodiment as shown in FIG. 6, a channel 320 may be provided in the face of the seal member 12 facing the substrate W inwardly (i.e. nearer to the optical axis of the projection system) of the first gas outlet 14. The channel 320 may have the same construction as the gas in- and out-lets 14, 15, 216.

Using the channel 320 pressure P2 may be varied independently of pressure P3. Alternatively, by opening this channel to environmental pressure above the liquid level in the reservoir 10, the consumption of liquid from the reservoir during operation is greatly reduced. This embodiment has been illustrated in combination with the second embodiment though the channel 320 may be used in combination with any of the other embodiments, in particular the first embodiment. A further advantage is that the gas inlet 15 and first gas outlet 14 (and for certain embodiments second gas outlet 216) are not disturbed.

Furthermore, although only three elements have been illustrated any number of channels may be incorporated into the face of the seal member 12 facing the substrate W, each channel being at a pressure to improve stiffness, liquid consumption, stability or other property of the liquid supply system.

EMBODIMENT 4

Figure 7:
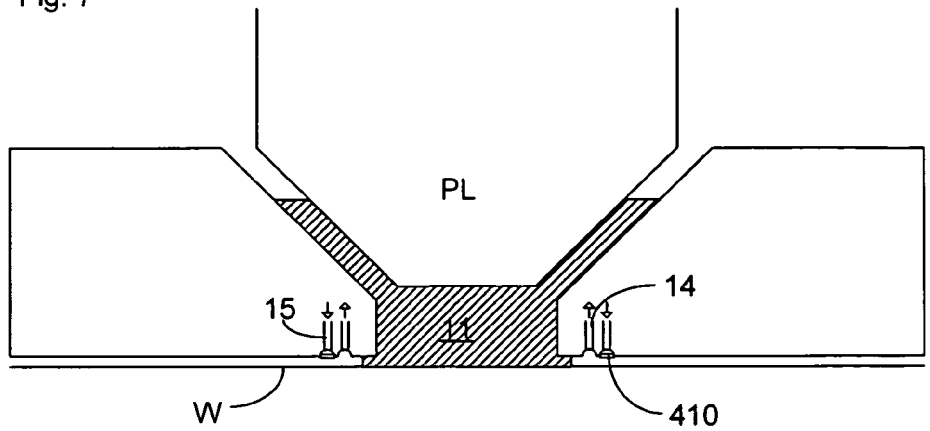
FIG. 7 depicts the liquid reservoir of a fourth embodiment of the present invention.
Figure 8:
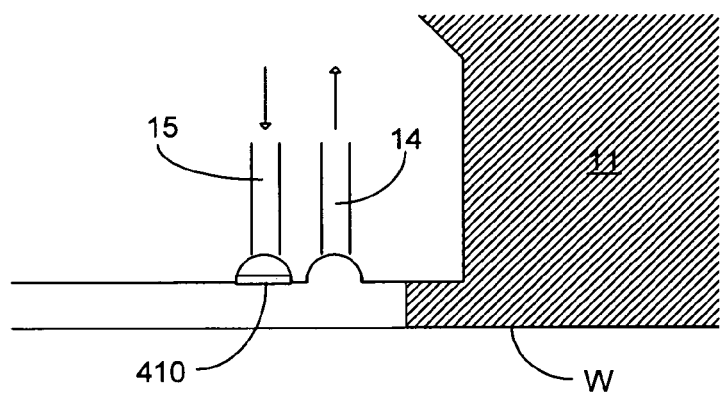
FIG. 8 is an enlarged view of part of the reservoir of the fourth embodiment of the present invention.

A fourth embodiment which is illustrated in FIGS. 7 and 8 is the same as the first embodiment except as described below. However, the fourth embodiment may also be advantageously used with any of the other embodiments described.

In the fourth embodiment a porous member 410, in an embodiment porous carbon or a porous ceramic member, is attached to the gas inlet 15 where gas exits the bottom face of the seal member 12. In an embodiment, the bottom of the porous member is co-planar with the bottom of the seal member. This porous carbon member 410 is insensitive to surfaces which are not completely flat (in this case substrate W) and the gas exiting the inlet 14 is well distributed over the entire exit of the inlet. The advantage gained by using the porous member 410 is also apparent when the seal member 12 is positioned partly over the edge of the substrate W as at this point the surface which the gas seal encounters is uneven.

In a variant of the fourth embodiment, the porous member 410 can be placed in the vacuum channel(s) 14. The porous member 410 should have a porosity chosen to maintain under pressure while preventing unacceptable pressure loss. This is advantageous when imaging the edge of the substrate W and the gas bearing moves over the edge of the substrate W because although the preload force at the position of the edge might be lost, the vacuum channel is not contaminated with a large and variable amount of gas, greatly reducing variations in the preload and as a consequence variation in flying height and forces on the stage.

EMBODIMENT 5

All of the above described embodiments typically have liquid in the reservoir 10 exposed to a gas, such as air, with a free surface. This is to prevent the final element of the projection system PL from breaking in a case of a crash due to build up of hydrostatic forces on the projection system. During a crash the liquid in the reservoir 10 is unconstrained such that the liquid will easily give, i.e. be forced upwards, when the projection system PL moves against it. The disadvantage of this solution is that surface waves may occur on the free surface during operation thereby transmitting disturbance forces from the substrate W to the projection system PL, which is undesirable.

One way of solving this problem is to ensure that the reservoir 10 is completely contained within a seal member, particularly the upper surface. Liquid is then fed to the reservoir 10 through a duct from a secondary reservoir. That secondary reservoir can have an unconstrained top surface and during a crash liquid is forced through the duct into the second reservoir such that the build up of large hydrostatic forces in the first reservoir 10 on the projection system can be avoided.

In such a closed system the local build up of pressure in the liquid on the projection system is avoided by ensuring that the duct connecting the reservoirs has a cross-sectional area equivalent to a duct with a radius according to the following equation $$R = \left(\frac{8\Delta V \eta L}{\pi \Delta P t}\right)^{1/4}$$

where R is the duct radius, $\Delta V$ is the volume of liquid which has to be removed from the reservoir 10 within time t, L is the length of the duct, $\eta$ is viscosity of the liquid and $\Delta P$ is the pressure difference between the secondary reservoir and the primary reservoir 10. If an assumption is made that the substrate table can crash with a speed of 0.2 m/sec (measured by experiment) and $\Delta P_{max}$ is $10^4$ Pa (about the maximum pressure the final element of the project system can withstand before damage results), the pipe radius needed is about 2.5 millimeters for a duct length of 0.2 m. In an embodiment, the effective radius of the duct is at least twice the minimum given by the formula.

Figure 9:
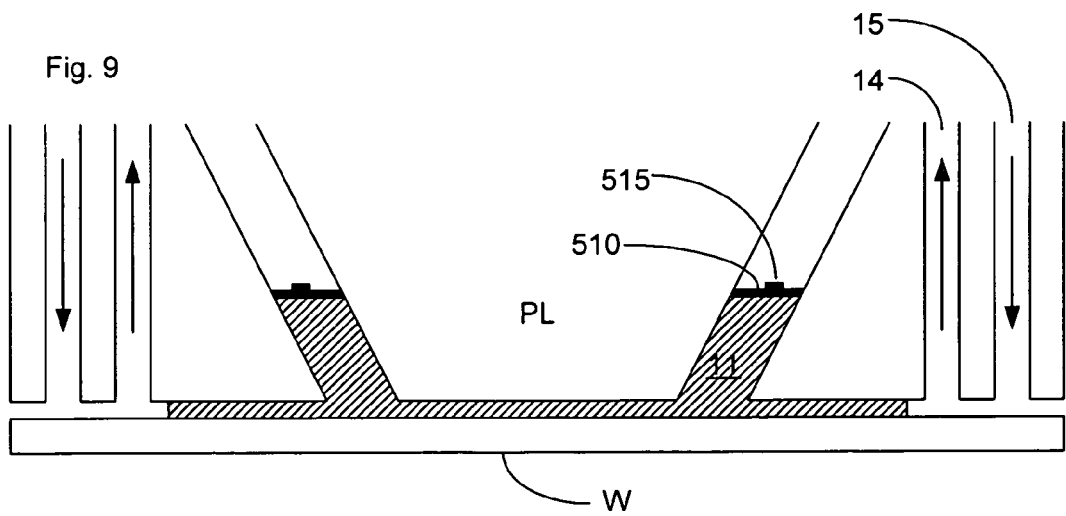
FIG. 9 depicts the liquid reservoir of a fifth embodiment of the present invention.

An alternative way to avoid the buildup of waves in the liquid in the reservoir while still ensuring that the projection system PL is protected in a crash, is to provide the free surface of the liquid with a suppression membrane 510 on the top surface of the liquid in the reservoir 10. This solution uses a safety means 515 to allow the liquid to escape in the case of a crash without the build-up of too high a pressure. One solution is illustrated in FIG. 9. The suppression membrane may be made of a flexible material which is attached to the wall of the seal member 12 or the projection system in such a way that before the pressure in the liquid reaches a predetermined allowed maximum, liquid is allowed to deform the flexible suppression membrane 510 such that liquid can escape between the projection system PL and the suppression membrane 510 or between the suppression membrane and the seal member, respectively. Thus in a crash it is possible for liquid to escape above the safety membrane without damaging the projection system PL. For this embodiment it is obviously desirable to have a space above the suppression membrane of at least the volume of a reservoir 10. Thus the flexible membrane is stiff enough to prevent the formation of waves in the top surface of the liquid in the reservoir 10 but is not stiff enough to prevent liquid escaping once the liquid reaches a predetermined hydrostatic pressure. The same effect can be achieved by use of pressure valves 515 which allow the free-flow of liquid above a predetermined pressure in combination with a stiffer suppression membrane.

An alternative form of suppression means is to place a high viscosity liquid on the top free surface of the liquid in the reservoir 10. This would suppress surface wave formation while allowing liquid to escape out of the way of the projection system PL in the case of a crash. Obviously the high viscosity liquid must be immiscible with the liquid used in the space 10.

A further alternative for the liquid suppression means 510 is for it to comprise a mesh. In this way the top surface of the liquid can be split into several parts each of smaller area. In this way, development of large surface waves which build up due to resonance and disturb the projection system is avoided because the surface area of the several parts is equal to the mesh opening so that the generation of large surface waves is effectively damped. Also, as the mesh allows flow of liquid through its openings, an effective pressure release mechanism is provided for the protection of the projection system in the case of a crash.

EMBODIMENT 6

Figure 10:
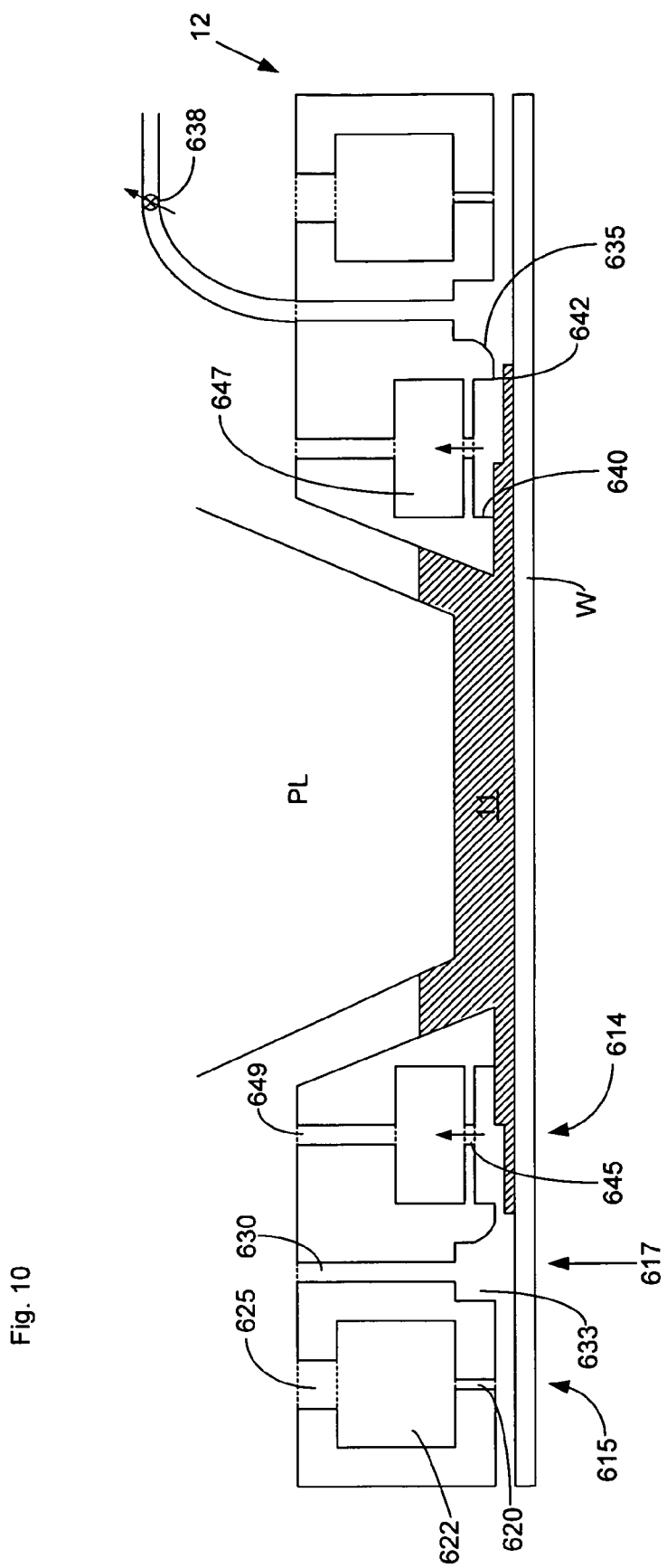
FIG. 10 depicts the liquid reservoir of a sixth embodiment of the present invention.
Figure 11:
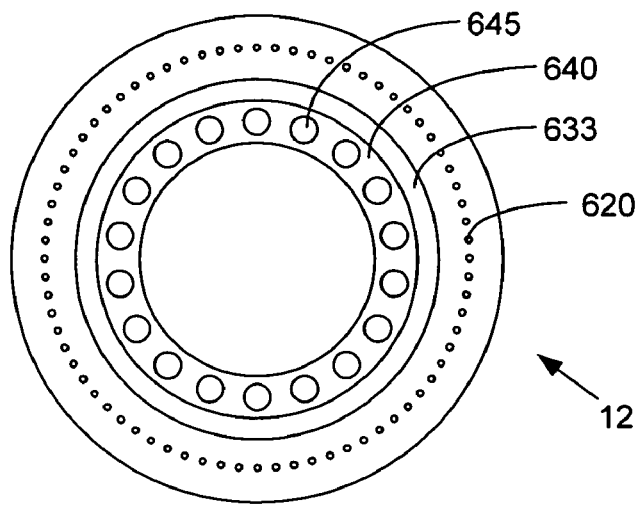
FIG. 11 depicts, in plan, the underside of the seal member of the sixth embodiment.

A sixth embodiment as illustrated in FIGS. 10 and 11 is the same as the first embodiment except as described below. The sixth embodiment uses several of the ideas in the foregoing embodiments.

As with the other embodiments, the immersion liquid 11 is confined to an area between the projection system PL and the substrate W by a seal member 12, in this case, positioned below and surrounding the final element of the projection system PL.

The gas seal between the seal member 12 and the substrate W is formed by three types of in-and-out-let. The seal member is generally made up of an outlet 614, an inlet 615 and a further inlet 617. These are positioned with the outlet 614 nearest the projection system PL, the further inlet 617 outwardly of the outlet 614 and the inlet 615 furthest from the projection system PL. The inlet 615 comprises a gas bearing in which gas is provided to a plurality of outlet holes 620 in the surface of the seal member 12 facing the substrate W via a (annular) chamber 622. The force of the gas exiting the outlet 620 both supports at least part of the weight of the seal member 12 as well as providing a flow of gas towards the outlet 614 which helps seal the immersion liquid to be confined to a local area under the projection system PL. A purpose of the chamber 622 is so that the discrete gas supply orifice(s) 625 provide gas at a uniform pressure at the outlet holes 620. The outlet holes 620 are about 0.25 mm in diameter and there are approximately 54 outlet holes 620. There is an order of magnitude difference in flow restriction between the outlet holes 620 and the chamber 622 which ensures an even flow out of all of the outlet holes 620 despite the provision of only a small number or even only one main supply orifice 625.

The gas exiting the outlet holes 620 flows both radially inwardly and outwardly. The gas flowing radially inwardly to and up the outlet 614 is effective to form a seal between the seal member 12 and the substrate W. However, it has been found that the seal is improved if a further flow of gas is provided by a further inlet 617. Passage 630 is connected to a gas source, for example the atmosphere. The flow of gas radially inwardly from the inlet 615 is effective to draw further gas from the further inlet 617 towards the outlet 614.

A (annular) groove 633 which is provided at the end of the passage 630 (rather than a series of discrete inlets) ensures that the sealing flow of gas between the inner most edge of the groove 633 and the outlet 614 is even around the whole circumference. The groove is typically 2.5 mm wide and of a similar height.

The inner most edge 635 of the groove 633 is, as illustrated, provided with a radius to ensure smooth flow of the gas through passage 630 towards the outlet 614.

The outlet 614 also has a continuous groove 640 which is approximately only 0.7 mm high but 6 to 7 mm wide. The outer most edge 642 of the groove 640 is provided as a sharp, substantially 90°, edge so that the flow of gas, in particular the flow of gas out of further inlet 630 is accelerated to enhance the effectiveness of the gas seal. The groove 640 has a plurality of outlet holes 645 which lead into a (annular) chamber 647 and thus to discrete outlet passage 649. In an embodiment, the plurality of outlet holes 645 are approximately 1 mm in diameter such that liquid droplets passing through the outlet holes 645 are broken up into smaller droplets.

The effectiveness of liquid removal of the seal member 12 can be adjusted by an adjustable valve 638 connected to the further inlet 617. The valve 638 is effective to adjust the flow through further inlet 617 thereby to vary the effectiveness of liquid removal of the gas seal 12 through outlet 614.

In an embodiment, the overall diameter of the seal member is of the order of 100 mm.

FIG. 11 shows, in plan, the underside of the seal member 12 of FIG. 10. As can be seen, the inlet 615 is provided as a plurality of discrete inlet holes 620. This is advantageous over the use of a groove for the main inlet 615 because a groove as a gas bearing has a capacity (because of the compressible nature of gas) such that vibrations can be set up in such a system. Small inlet holes 620 have a lower volume of gas in them and therefore suffer less from problems arising from capacity.

The use of a further inlet 617 in the form of a groove 633 can be used to ensure a continuous gas flow around the whole periphery of the seal member 12 which would not necessarily be possible when only using discrete inlet holes 620. The provision of the outlets 645 as discrete entities is not a problem because of the provision of the groove 640 which is effective, like chambers 647 and 622, to even out the flow.

The inlets for liquid are not illustrated in the seal member 12 of FIGS. 10 and 11. The liquid may be provided in the same manner as illustrated in the foregoing embodiments or, alternatively, any of the liquid inlets and outlets as described in European patent application nos. EP 03256820.6 and EP 03256809.9.

EMBODIMENT 7

Figure 12:
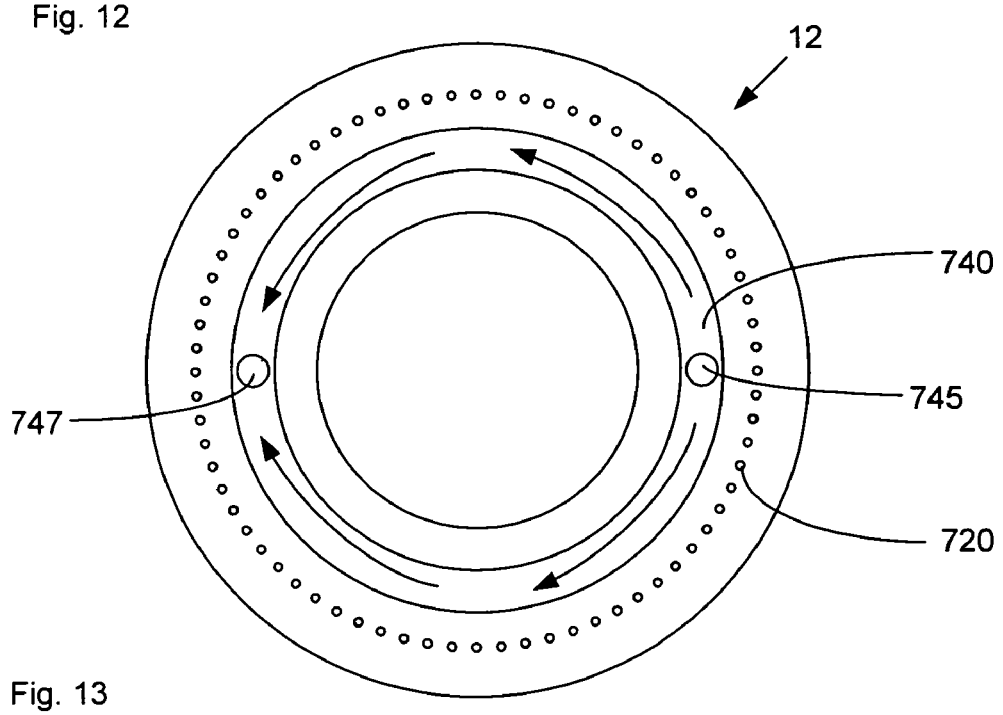
FIG. 12 depicts, in plan, the underside of the seal member of a seventh embodiment.
Figure 13:
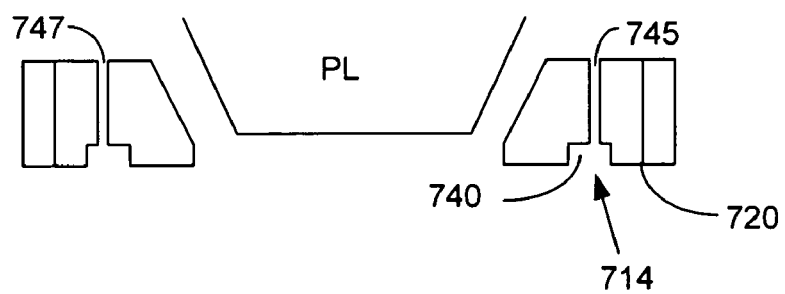
FIG. 13 depicts, in cross section, the liquid reservoir of the seventh embodiment.

A seventh embodiment is similar to the sixth embodiment except as described below. FIG. 12 is a plan view of the underside of the seal member 12 similar to that shown in FIG. 11. In FIG. 12 the seal member is not provided with a further inlet as in the sixth embodiment though this can optionally be added. FIG. 13 shows a cross-section.

The seal member 12 of the seventh embodiment comprises a gas bearing 715 formed by inlet holes 720 and which is of the same overall design as the sixth embodiment. An outlet 714 comprises a (annular) groove 740 with only two passages 745, 747. which lead to a gas source and a vacuum source respectively. In this way a high speed flow of gas from the gas source connected to passage 745 towards the vacuum source connected to passage 747 can be established. With this high speed flow of gas, immersion liquid may be drained more effectively. Furthermore, by creating a larger restricted vacuum flow in the vacuum chamber, flow fluctuations due to variations in the height of the seal member 12 above the substrate W or other leakage sources in the surface will not influence the vacuum chamber pressure providing a preload for the gas bearing.

EMBODIMENT 8

An eighth embodiment will be described in relation to FIG. 14 and is the same as the first embodiment except as described below.

Figure 14:
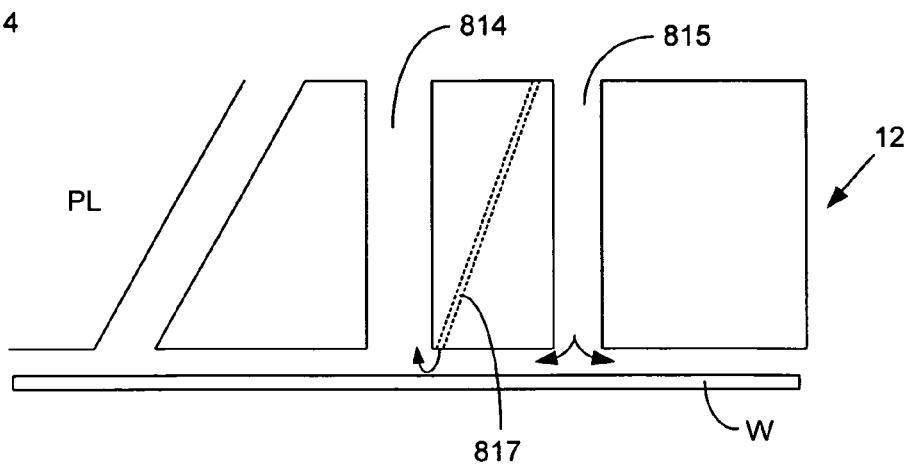
FIG. 14 depicts, in cross section, the liquid reservoir of an eighth embodiment.

As can be seen from FIG. 14, the eighth embodiment has a seal member 12 with an inlet 815 and an outlet 814 just like the first embodiment. However, a further inlet 817 is provided which is arranged so that a jet of gas can be formed which increases the velocity of the gas on the surface of the substrate W below or radially outwardly of the outlet 814 so that immersion liquid is more effectively removed from the surface of the substrate W. The further inlet 817 has an exit provided by a nozzle which is directed towards the substrate W at an angle radially inwardly towards the projection system PL. Thus, the otherwise laminar gas flow (with a Reynolds number of around 300) between the inlet 815 and the outlet 814 and which has a simple parabolic speed distribution with a zero speed on the surface of the substrate, which may not be able to remove the last few micrometers of liquid film from the substrate, can be improved because the further inlet 817 ensures that gas with a higher gas velocity is in contact with the substrate surface.

From FIG. 14 it can be seen that the exit nozzle of the further inlet 817 is provided radially outwardly of the outlet 814 but closer to the outlet 814 than to the inlet 815.

EMBODIMENT 9

Figure 15:
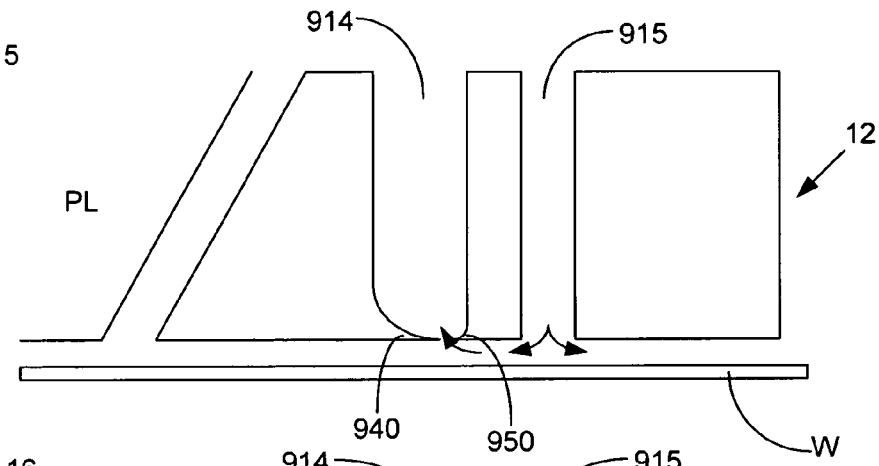
FIG. 15 depicts, in cross section, the liquid reservoir of a ninth embodiment.
Figure 16:
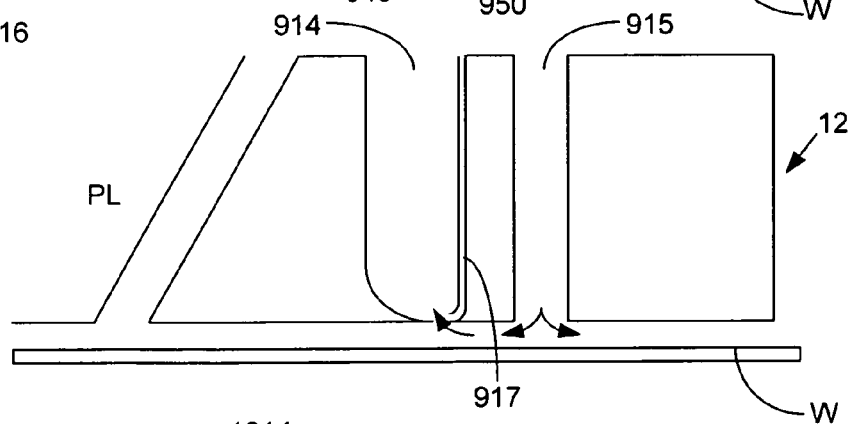
FIG. 16 depicts, in cross section, the liquid reservoir of an alternative ninth embodiment.

A ninth embodiment is illustrated in FIGS. 15 and 16 and is the same as the first embodiment except as described below.

In the ninth embodiment, the mouth of outlet 914 in the bottom surface of the seal member 12 which faces the substrate W, is modified to increase the velocity of gas into the outlet 914. This is achieved by reducing the size of the mouth of the inlet 914 while keeping the passageway of the outlet 914 the same size. This is achieved by providing a smaller mouth by extending material of the seal member 12 towards the center of the passage to form an outer additional member 950 and an inner additional member 940. The outer additional member 950 is smaller than the inner additional member 940 and the gap between those two members 940, 950 is, in an embodiment, approximately 20 times smaller than the remainder of the outlet 914. In an embodiment, the mouth is approximately 100 to 300 μm in width.

In FIG. 16 a further alternative version of the ninth embodiment is depicted in which a further inlet 917 similar to the further inlet 817 of the eight embodiment is provided. However, in this case the further inlet 917 provides a jet of flow substantially parallel to the surface of the substrate W so that the gas entering the mouth of the outlet 914 is accelerated.

EMBODIMENT 10

Figure 17:
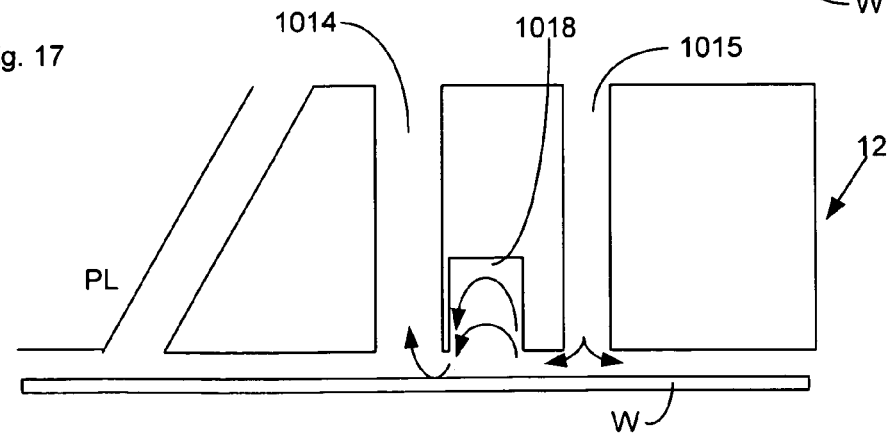
FIG. 17 depicts, in cross section, the liquid reservoir of a tenth embodiment.

A tenth embodiment is illustrated in FIG. 17 and is the same as the first embodiment except as described below.

In the tenth embodiment, the efficiency of liquid removal may be improved by increasing the velocity of gas on the surface of the substrate W along the same principles as in the eight embodiment. Gas leaving inlets 1015 and moving radially inwardly towards an outlet 1014 passes underneath a (annular) groove 1018. The effect of the groove, as illustrated, is for the gas to enter the groove on its radially outer most side and to exit it, with an angle towards the substrate W, on the radially inward side. Thus, the speed of the gas on the surface of the substrate W at the entrance to the outlet 1014 is increased and liquid removal efficiency is improved.

It will be clear that features of any embodiment can be used in conjunction with some or all features of any other embodiment.

While specific embodiments of the invention have been described above, it will be appreciated that the invention may be practiced otherwise than as described. The description is not intended to limit the invention.

The invention claimed is:

1. A lithographic projection apparatus, comprising:
a support structure configured to hold a patterning device and movable in a scanning direction, the patterning device configured to pattern a beam of radiation according to a desired pattern;
a substrate table configured to hold a substrate and movable in a scanning direction;
a projection system configured to project the patterned beam onto a target portion of the substrate; and
a liquid confinement structure extending along at least a part of a boundary of a space between the projection system and the substrate table, the space having a cross-sectional area smaller than the area of the substrate, the liquid confinement structure positioned adjacent a final surface of the projection system and comprising:
a first inlet to supply liquid, through which the patterned beam is to be projected, to the space,
a first outlet to remove liquid after the liquid has passed under the projection system,
a second inlet formed in a face of the structure, the face arranged to oppose a surface of the substrate, and located radially outward, with respect to an optical axis of the projection system, of the space to supply gas, and
a second outlet formed in the face and located radially outward, with respect to an optical axis of the projection system, of the second inlet to remove gas.

2. The apparatus according to claim 1, wherein the area has a periphery conforming to a shape of an image field of the projection system.

3. The apparatus according to claim 1, wherein the first inlet is configured to supply the liquid at a first side of the projection system and the first outlet is configured to remove the liquid at a second side of the projection system as the substrate is moved under the projection system in a direction from the first side to the second side.

4. The apparatus according to claim 1, wherein the second inlet, the second outlet, or both, extend around the final surface of the projection system.

5. The apparatus according to claim 1, wherein the second inlet, the second outlet, or both, comprise a groove in the face.

6. The apparatus according to claim 5, wherein the groove is circular and extends around the space.

7. The apparatus according to claim 1, wherein the structure forms a closed loop around the space.

8. The apparatus according to claim 1, further comprising a porous member disposed over the second inlet to evenly distribute gas flow over the area of the second inlet.

9. A lithographic projection apparatus, comprising:
a support structure configured to hold a patterning device, the patterning device configured to pattern a beam of radiation according to a desired pattern;
a substrate table configured to hold a substrate;
a projection system configured to project the patterned beam onto a target portion of the substrate; and
a liquid confinement structure extending along at least a part of a boundary of a space between the projection system and the substrate table, the space having a cross-sectional area smaller than the area of the substrate, the liquid confinement structure positioned adjacent a final surface of the projection system and comprising:
a first inlet configured to supply a liquid, through which the patterned beam is to be projected, to the space,
a second inlet configured to supply gas and formed in a face of the structure, the face arranged to oppose a surface of the substrate and the second inlet located radially outward, with respect to an optical axis of the projection system, of and substantially around the space, and
an outlet configured to remove gas and formed in the face, the outlet located radially outward, with respect to an optical axis of the projection system, of and substantially around the second inlet.

10. The apparatus according to claim 9, wherein the area has a periphery conforming to a shape of an image field of the projection system.

11. The apparatus according to claim 9, wherein the first inlet is configured to supply the liquid at a first side of the projection system and the apparatus further comprises a second outlet configured to remove the liquid at a second side of the projection system as the substrate is moved under the projection system in a direction from the first side to the second side.

12. The apparatus according to claim 9, wherein the second inlet, the outlet, or both, comprise a groove in the face.

13. The apparatus according to claim 12, wherein the groove is circular.

14. The apparatus according to claim 9, wherein the support structure and the substrate table are movable in a scanning direction to expose the substrate.

15. The apparatus according to claim 9, further comprising a porous member disposed over the second inlet to evenly distribute gas flow over the area of the second inlet.

16. A lithographic projection apparatus, comprising:

a support structure configured to hold a patterning device, the patterning device configured to pattern a beam of radiation according to a desired pattern;

a substrate table configured to hold a substrate;

a projection system configured to project the patterned beam onto a target portion of the substrate; and a liquid confinement structure extending along at least a part of a boundary of a space between the projection system and the substrate table, the space having a cross-sectional area smaller than the area of the substrate, the liquid confinement structure positioned adjacent a final surface of the projection system and comprising:

a first inlet configured to supply a liquid, through which the patterned beam is to be projected, to the space, and a second inlet configured to supply gas and formed in a face of the structure, the face arranged to oppose a surface of the substrate and the second inlet located radially outward, with respect to an optical axis of the projection system, of the space and having a porous member to evenly distribute gas flow over an area of the second inlet.

17. The apparatus according to claim 16, further comprising an outlet configured to remove gas and formed in the face, the outlet located radially outward, with respect to an optical axis of the projection system, of the second inlet.

18. The apparatus according to claim 16, wherein the first inlet is configured to supply the liquid at a first side of the projection system and the apparatus further comprises an outlet configured to remove the liquid at a second side of the projection system as the substrate is moved under the projection system in a direction from the first side to the second side.

19. The apparatus according to claim 16, wherein the support structure and the substrate table are movable in a scanning direction to expose the substrate.

20. The apparatus according to claim 16, wherein the structure forms a closed loop around the space.

* * * * *